(12) United States Patent
Hsieh et al.

(10) Patent No.: US 11,764,797 B2
(45) Date of Patent: Sep. 19, 2023

(54) OFFSET MITIGATION FOR AN ANALOG-TO-DIGITAL CONVERTOR

(71) Applicant: XILINX, INC., San Jose, CA (US)

(72) Inventors: Kai-An Hsieh, Tainan City (TW); Tan Kee Hian, Singapore (SG); Kevin Zheng, San Jose, CA (US)

(73) Assignee: XILINX, INC., San Jose, CA (US)

( * ) Notice: Subject to any disclaimer, the term of this patent is extended or adjusted under 35 U.S.C. 154(b) by 6 days.

(21) Appl. No.: 17/449,293

(22) Filed: Sep. 29, 2021

(65) Prior Publication Data
US 2023/0115601 A1    Apr. 13, 2023

(51) Int. Cl.
*H03M 1/06*    (2006.01)
*H03M 1/10*    (2006.01)
*H03M 1/00*    (2006.01)
*H03M 1/12*    (2006.01)

(52) U.S. Cl.
CPC .............. *H03M 1/0607* (2013.01); *H03M 1/00* (2013.01); *H03M 1/06* (2013.01); *H03M 1/10* (2013.01); *H03M 1/12* (2013.01)

(58) Field of Classification Search
CPC ......... H03M 1/0607; H03M 1/06; H03M 1/12; H03M 1/10; H03M 1/00
See application file for complete search history.

(56) References Cited

U.S. PATENT DOCUMENTS

| | | | |
|---|---|---|---|
| 8,736,480 B1* | 5/2014 | Cowley et al. | H03M 1/0626 341/172 |
| 2019/0058486 A1* | 2/2019 | Fan | H03M 1/1245 |

OTHER PUBLICATIONS

Alpman, E. et al. "A 1.1V 50mW 2.5GS/s 7b Time-Interleaved C-2C SAR ADC in 45nm LP digital CMOS," 2009 IEEE International Solid-State Circuits Conference - Digest of Technical Papers, 2009, pp. 76-77.
Chen, V. H.-C. et al. "An 8.5mW 5GS/s 6b flash ADC with dynamic offset calibration in 32nm CMOS SOI," 2013 Symposium on VLSI Circuits, 2013, pp. C264-C265.
Figueiredo, P. M., et al., "A 90nm CMOS 1.2v 6b 1GS/s two-step subranging ADC," 2006 IEEE International Solid State Circuits Conference - Digest of Technical Papers, 2006, pp. 2320-2329.
Lee, M.-J. E, et al., "Low-power area-efficient high-speed I/O circuit techniques," IEEE Journal of Solid-State Circuits, vol. 35, No. 11, pp. 1591-1599, Nov. 2000.

* cited by examiner

*Primary Examiner* — Joseph J Lauture
(74) *Attorney, Agent, or Firm* — Patterson + Sheridan, LLP

(57) ABSTRACT

Analog-to-digital converter circuitry includes comparator circuitry, capacitor analog-to-digital converter circuitry (CDA), and successive approximation register (SAR) circuitry. The comparator circuitry includes a non-inverting input and an inverting input to selectively receive a differential voltage signal, and an output. The CDAC circuitry includes a first capacitor network having a first plurality of capacitors. A first capacitor of the first plurality of capacitors includes a first terminal connected to the non-inverting input and a second terminal selectively connected to a first voltage potential and a second voltage potential. The first voltage potential is greater than the second voltage potential. The SAR circuitry is connected to the output and the first capacitor network, and connects, during a first period, the second terminal of the first capacitor to the second voltage potential. The non-inverting input and the inverting input are connected to the differential voltage signal during the first period.

20 Claims, 6 Drawing Sheets

| $OS_{P,i-1}$ | $OS_{M,i-1}$ | INJECTED OFFSET VOLTAGE (DIFFERENTIAL) |
|---|---|---|
| 0 | 0 | 0 |
| 1 | 0 | $+\dfrac{V_{FS}}{2^{B-(i-1)}}$ |
| 0 | 1 | $-\dfrac{V_{FS}}{2^{B-(i-1)}}$ |

FIG. 5

OFFSET MITIGATION FOR AN ANALOG-TO-DIGITAL CONVERTOR

TECHNICAL FIELD

Various embodiments relate generally to analog-to-digital converters (ADCs), and more specifically, to offset mitigation within ADCs.

BACKGROUND

Communication systems transport data from a transmitter to a receiver over a data link. Before transmission, data may be encoded in analog or digital formats. Some communication systems may modulate a carrier signal to carry the data from the transmitter to the receiver. At the receiver, data may be recovered by demodulating the received signal. The data links may be part of a wired communication systems or wireless communication systems. Wired communication systems may include telephone networks, cable television, internet service provider, and fiber-optic communication nodes, among others. Wireless communication systems may transfer information between two or more points that are not connected by an electrical conductor using electromagnetic waves propagating through a medium, such as air or free space. Some wireless links may transport information in the form of light.

At a receiver in a digital communication system, a digitally-encoded data stream is received as an analog signal and converted to a digital signal by an analog-to-digital converter (ADC). The ADC may interpret the data stream as a function of time. For example, some ADCs may be synchronized to a clock signal that determines when a voltage signal is to be sampled. However, mismatch within the receiver circuitry, e.g., comparator mismatch, introduces offset errors within the receiver circuitry, which reduces the resolution of the ADC. Current techniques to mitigate the mismatch (e.g., offset) add additional loading to the comparator and/or utilizes additional calibration circuits, that limits the operating speed of the ADC and increases the circuit size of the ADC. Accordingly, there is a need for an improved offset mitigation technique that mitigates mismatch within the ADC without adding additional loading and relying on additional calibration circuits to increase the available operating speeds without increasing the circuit area size of the ADC.

SUMMARY

In the following description, a method for offsetting mitigation within an analog-to-digital convertor (ADC) is described. The method utilizes capacitor digital-to-analog converter (CDAC) circuitry to inject an offset charge into the comparator circuitry of the ADC to mitigate offset within the ADC. For example, during a tracking period, one or more capacitors of the CDAC is connected to a voltage potential to be charge instead of being reset. After the tracking period, and before the comparator processes an input signal, the one or more capacitors inject the corresponding charge to the comparator circuitry to compensate for mismatch (e.g., offset) within the ADC.

In one example, ADC circuitry comprises comparator circuitry, CDAC circuitry, and SAR circuitry. The comparator circuitry comprises a non-inverting input and an inverting input configured to selectively receive a differential voltage signal, and an output. The CDAC circuitry comprises a first capacitor network comprising a first plurality of capacitors. A first capacitor of the first plurality of capacitors comprises a first terminal connected to the non-inverting input and a second terminal configured to be selectively connected to a first voltage potential and a second voltage potential. The first voltage potential is greater than the second voltage potential. The SAR circuitry is connected to the output and the first capacitor network, and is configured to connect, during a first period, the second terminal of the first capacitor to the second voltage potential. The non-inverting input and the inverting input are connected to the differential voltage signal during the first period.

In one example, a method for operating ADC circuitry comprises connecting, during a first period, a non-inverting input and an inverting input of comparator circuitry to a differential voltage signal. The method further comprises connecting, during the first period and via SAR circuitry, a first terminal of a first capacitor of a first capacitor network of CDAC circuitry to a second voltage potential. The first terminal of the first capacitor is configured to be selectively connected to a first voltage potential and the second voltage potential. The first voltage potential is greater than the second voltage potential. The second terminal of the first capacitor is connected to the non-inverting input.

In one example, receiver circuitry comprises ADC circuitry configured to receive an input signal and output an output signal based on the input signal. The ADC circuitry comprises comparator circuitry and CDAC circuitry. The comparator circuitry comprises a non-inverting input, an inverting input, and an output. The comparator circuitry is configured to selectively receive a differential voltage signal at the non-inverting input and inverting input. The differential voltage signal is based on the input signal. The CDAC circuitry comprises a first capacitor network comprising a first plurality of capacitor. A first capacitor of the first plurality of capacitors comprises a first terminal connected to the non-inverting input and a second terminal configured to be selectively connected to a first voltage potential and a second voltage potential. The first voltage potential is greater than the second voltage potential. The ADC circuitry is configured to connect, during a first period, the second terminal of the first capacitor to the second voltage potential. The non-inverting input and the inverting input are connected to the differential voltage signal during the first period.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 5 illustrates a truth table for determining the amount of offset voltage, according to one or more examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
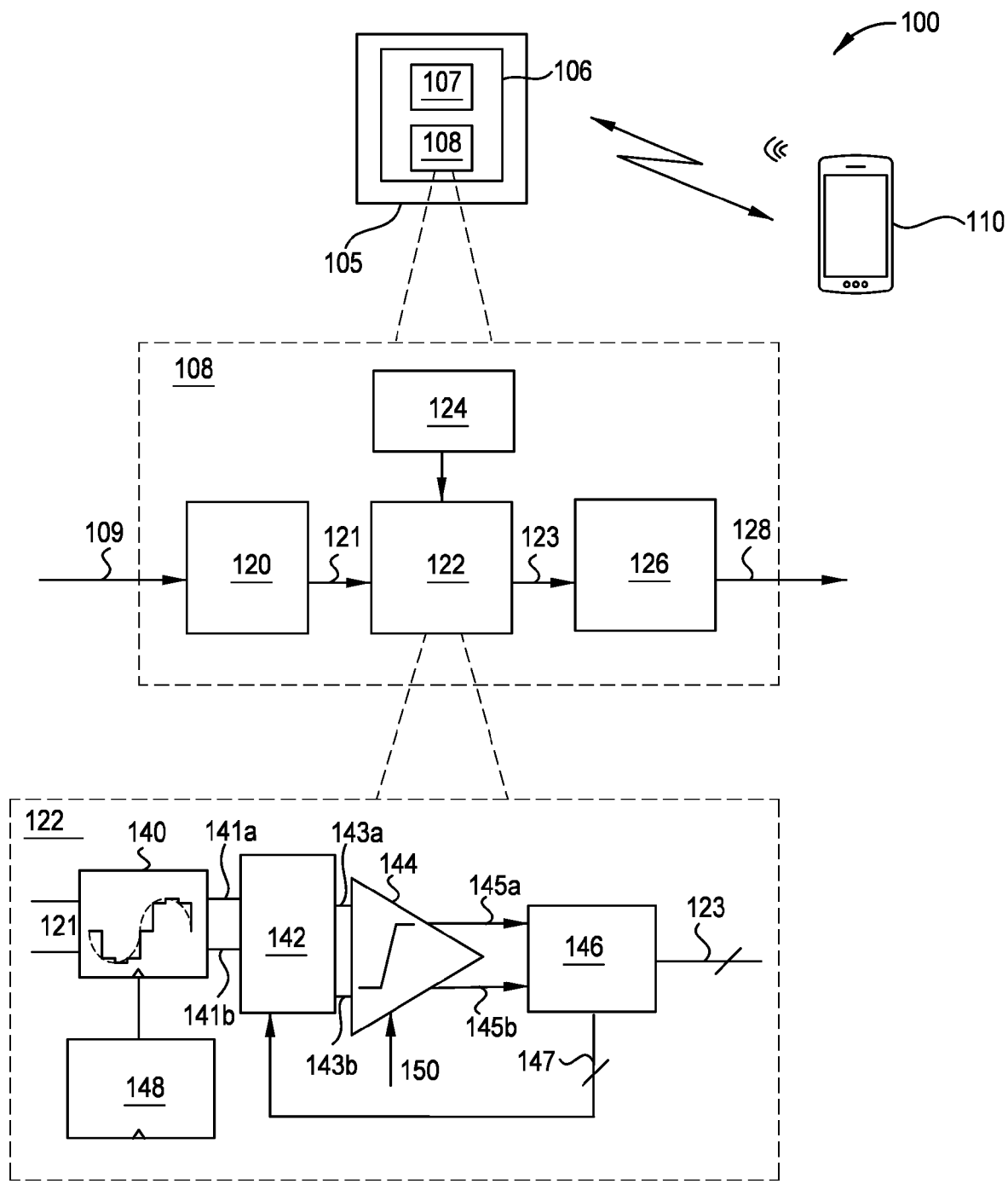
FIG. 1 illustrates a schematic block diagram of a communication system, according to one or more examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Integrated circuits (ICs) are used in a communication system to support various data communication protocols over wide frequency ranges. In such communication systems, receiver circuitry converts received analog signals into digital signals using analog-to-digital converter (ADC) circuitry. In one example, the ADC circuitry is a successive-approximation-register (SAR) ADC circuitry that converts a continuous analog waveform into a discrete digital representation. For example, the SAR ADC circuitry performs a plurality of conversions on the received analog signal using a binary search through two or more quantization levels to select a digital output for each conversion.

Mismatch may exist within the circuit elements of the ADC circuitry, resulting in offset error within the output digital signal. In some instances, the mismatch is due to comparator circuitry mismatch within the ADC circuitry and may limit the resolution of the ADC circuitry. To mitigate the offsets caused by the mismatch, capacitor digital-to-analog convertor (CDAC) circuitry of the ADC circuitry is used to inject an offset voltage (e.g., charge) into the comparator circuitry and other elements of the ADC circuitry. For example, instead of resetting one or more capacitors of the CDAC circuitry, one or more capacitors are charged and used to inject an offset voltage into the comparator circuitry. Reusing the CDAC circuitry to mitigate offset within the ADC circuitry, reduces the loading of the comparator and the circuit size of the ADC circuitry as compared to ADC circuitries that employ other methods for offset mitigation. Further, ADC circuitries that use CDAC circuitry for offset mitigation may operate at higher operating speeds as compared to ADC circuitries that employ other methods for offset mitigation, thus improving the speed and performance of electronic devices that incorporate the ADC circuitries described herein.

FIG. 1 illustrates a block diagram of a communication system 100, according to one or more examples. The communication system 100 includes a communication device 105 and an electronics device 110 (e.g., cell phone, laptop computer, an automobile, an appliance, and a home electronic device, among others). The communication device 105 receives and transmits data signals to and from the electronic device 110. The transmitted data signals may be analog data signal or digital data signals.

The communication device 105 may be a base station or another type of communication station that transmits and receives data signals. In one example, the communication device 105 includes transceiver circuitry 106 that transmits and receives data signals. The transceiver circuitry 106 includes transmitter circuitry 107 and receiver circuitry 108. The transmitter circuitry 107 transmits digital and/or analog data signals and the receiver circuitry 108 receives digital and/or analog data signal.

The receiver circuitry 108 is included within an IC. The IC is an application specific IC (ASIC) or a programmable IC (e.g., a field programmable gate array (FPGA)). In one example, the receiver circuitry 108 is a programmable device. For example, the receiver circuitry 108 may be a System-on-a-Chip (SoC) and include one or more subsystems that interact with each other to complete the tasks assigned to the receiver circuitry 108.

The receiver circuitry 108 includes a filter circuitry 120, ADC circuitry 122, phase-lock-loop (PLL) circuitry 124, and digital signal processing (DSP) circuitry 126. In other examples, the receiver circuitry 108 includes additional circuitry not illustrated in FIG. 1. The receiver circuitry 108 receives the input signal 109, and generates and outputs the output signal 128. The output signal 128 is generated based on the input signal 109. In one example, the input signal 109 is an analog signal and the output signal 128 is a digital signal.

The filter circuitry 120 receives the input signal 109 and generates voltage signal 121. The filter circuitry 120 may be a low-pass filter that filters interference within the input signal 109 to generate the voltage signal 121 (e.g., a filtered analog signal).

The ADC circuitry 122 samples and converts the voltage signal 121 into a digital signal 123. The sampling and conversion may be controlled by different clock signals. In one example, the PLL circuitry 124 provides the clock signals to the ADC circuitry 122. The digital signal 123 may be processed by the DSP circuitry 126.

The ADC circuitry 122 may be SAR ADC circuitry. In such an example, the digital signal 123 is an output code that is defined during a number of successive approximation cycles (SA cycles) of the SAR ADC circuitry. The ADC circuitry 122 may be a synchronous or asynchronous SAR ADC.

The ADC circuitry 122 includes a track and hold circuit 140, CDAC circuitry 142, comparator circuitry 144, SAR circuitry 146, and clock generation circuitry 148. The track and hold circuit 140 receives the voltage signal 121 and performs a sample and hold operation on the voltage signal 121. The voltage signal 121 is a differential voltage signal. The track and hold circuit 140 samples the voltage signal 121 to generate the differential voltage signal 141 during one or more sample stages. The clock generation circuitry 148 may be used to generate clock signals for the track and hold circuit 140.

The CDAC circuitry 142 is an n+1 bit DAC. N is greater than or equal to 0. In one example, the CDAC circuitry 142 is a 7 bit DAC. The CDAC circuitry 142 generates differential voltage signal 143 from the differential voltage signal 141. The differential voltage signal 143 is received at non-inverting (positive) and inverting (negative) inputs of the comparator circuitry 144. The CDAC circuitry 142 mitigates effects of common mode noise and coupling on within the receiver circuitry 108 or the ADC circuitry 122.

In one example, during each SA cycle of the ADC circuitry 122, the difference between voltage signals 143a and 143b of the differential voltage signal 143 is compared to zero by the comparator circuitry 144. If the difference is positive, a bit of one is attributed to the correspondent SA cycle, and the differential output of the CDAC circuitry 142 (difference between 143a and 143b) is reduced. Based on the difference being negative, the corresponding SA cycle bit is set to zero and the differential output of the CDAC circuitry 142 is increased.

In one example, the CDAC circuitry 142 compensates (mitigates) for offset (or offsets) within the ADC circuitry 122. For example, the CDAC circuitry 142 injects charge to a non-inverting and/or inverting input of the comparator circuitry 144 to mitigate offset within the differential signal 145 generated by the ADC circuitry 122.

The comparator circuitry 144 receives the differential voltage signal 143 and processes the voltage signal 143a with the voltage signal 143b to generate the voltage signals 145a, 145b (e.g., the differential signal 145). The comparator circuitry 144 processes the differential voltage signal 143 based on the clock signal 150. For example, the comparator circuitry 144 process the differential voltage signal 143 based on each cycle of the clock signal 150. The comparator circuitry 144 processes the differential voltage signal 143 during conversion cycles associated with SA cycles.

In one example, during each conversion cycle, the comparator circuitry 144 determines whether the difference between the voltage signals 143a and 143b is positive or negative. The SAR circuitry 146 outputs a negative control signal to a positive side of the CDAC circuitry 142 and a positive control signal to a negative side of the CDAC circuitry 142 based on the difference between the voltage signals 143a and 143b being positive. The SAR circuitry 146 outputs a positive control signal to a positive side of the CDAC circuitry 142 and a negative control signal to a negative side of the CDAC circuitry 142 based on the difference between the voltage signals 143a and 143b being negative.

Figure 2:
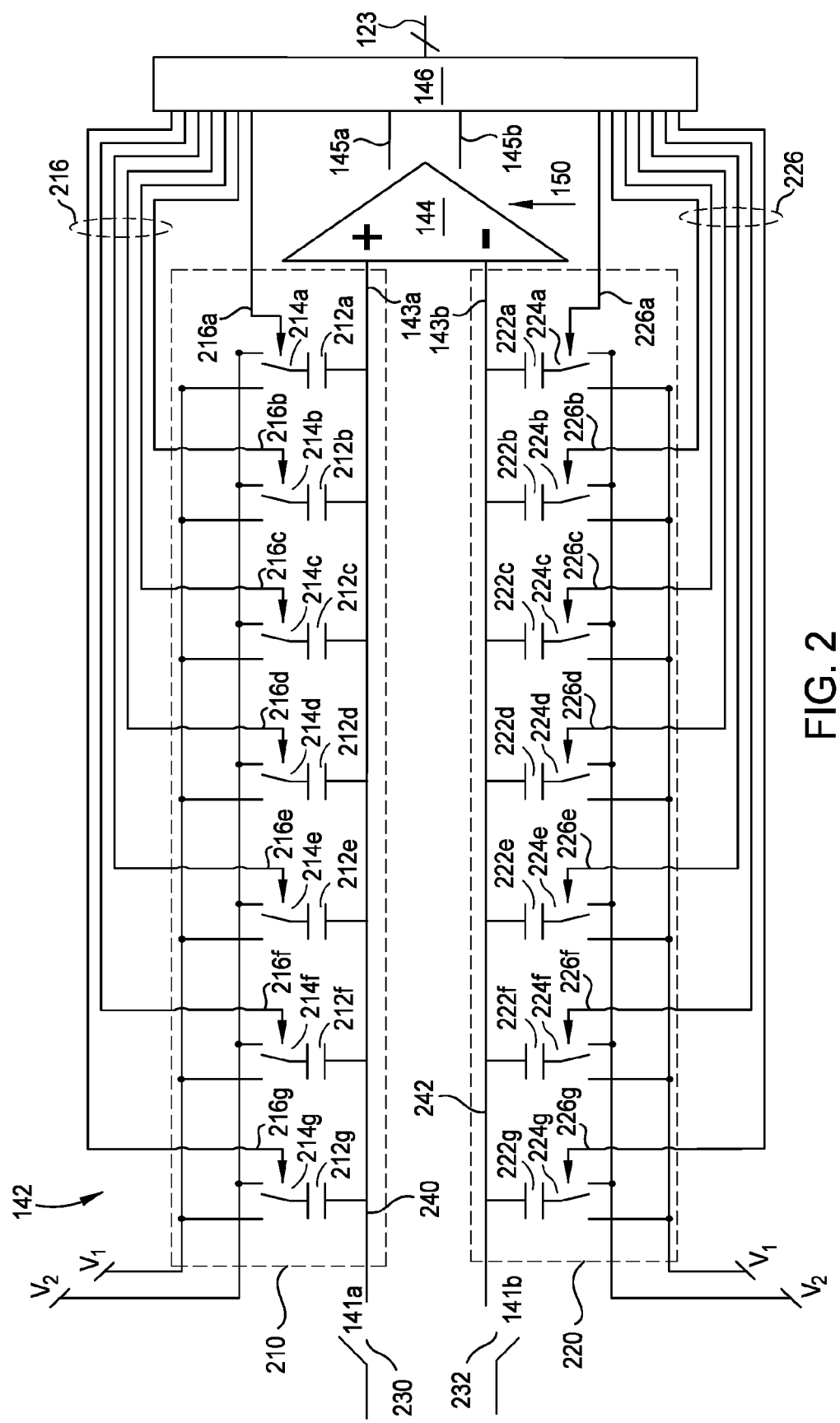
FIG. 2 illustrates a schematic diagram of analog-to-digital converter circuitry, according to one or more examples.

FIG. 2 illustrates a portion of the receiver circuitry, e.g., receiver circuitry 108, according to one or more examples. For example, FIG. 2 illustrates the CDAC circuitry 142, the comparator circuitry 144, and the SAR circuitry 146. The SAR circuitry 146 is coupled to the output of the comparator circuitry 144 and controls the CDAC circuitry 142 via the control lines 216 and 226.

The CDAC circuitry 142 includes capacitor network 210 and capacitor network 220. The capacitor network 210 includes capacitors 212 and switching circuitries 214. The capacitor network 220 includes capacitors 222 and switching circuitries 224. In the capacitor network 210, a first terminal each of the capacitors 212 is connected to a voltage potential $V_1$ and a voltage potential $V_2$ via a corresponding switching circuitry 214, and a second terminal of each of the capacitors 212 is connected to the trace 240 and the non-inverting input of the comparator circuitry 144. The voltage potential $V_1$ is greater than the voltage potential $V_2$. In one example, the voltage potential $V_1$ is a power supply voltage and the voltage potential $V_2$ is a ground voltage. Further, the voltage potentials $V_1$ and $V_2$ are direct current (DC) voltages. The trace 240 is connected to a non-inverting input of the comparator circuitry 144.

In the capacitor network 220, a first terminal of each of the capacitors 222 is connected to the voltage potential $V_1$ and the voltage potential $V_2$ via a corresponding switching circuitry 224, and a second terminal of each of the capacitors 222 is connected to the trace 242 and the inverting input of the comparator circuitry 144. The trace 242 is connected to the inverting input of the comparator circuitry 144.

A first terminal of each capacitor 212 is connected to the trace 240 and a second terminal of each capacitor 212 is connected to a respective switching circuitry 214. For example, a first terminal of the capacitor 212a is connected to the trace 240 and a second terminal of the capacitor 212a is connected to the switching circuitry 214a. The first terminal of the capacitor 212b is connected to the trace 240 and a second terminal of the capacitor 212b is connected to the switching circuitry 214b. The first terminal of the capacitor 212c is connected to the trace 240 and a second terminal of the capacitor 212c is connected to the switching circuitry 214c. The first terminal of the capacitor 212d is connected to the trace 240 and a second terminal of the capacitor 212d is connected to the switching circuitry 214d. The first terminal of the capacitor 212e is connected to the trace 240 and a second terminal of the capacitor 212e is connected to the switching circuitry 214e. The first terminal of the capacitor 212f is connected to the trace 240 and a second terminal of the capacitor 212f is connected to the switching circuitry 214f. The first terminal of the capacitor 212g is connected to the trace 240 and a second terminal of the capacitor 212g is connected to the switching circuitry 214g.

Each of the switching circuitries 214 is controlled via a corresponding control line 216 and a control signal communicated from the SAR circuitry 146 via the corresponding control line 216. For example, the switching circuitry 214a connects the capacitor 212a to the voltage potentials $V_1$ and $V_2$ based on a control signal provided via the control line 216a. The switching circuitry 214b connects the capacitor 212b to the voltage potentials $V_1$ and $V_2$ based on a control signal provided via the control line 216b. The switching circuitry 214c connects the capacitor 212c to the voltage potentials $V_1$ and $V_2$ based on a control signal provided via the control line 216c. The switching circuitry 214d connects the capacitor 212d to the voltage potentials $V_1$ and $V_2$ based on a control signal provided via the control line 216d. The switching circuitry 214e connects the capacitor 212e to the voltage potentials $V_1$ and $V_2$ based on a control signal provided via the control line 216e. The switching circuitry 214f connects the capacitor 212f to the voltage potentials $V_1$ and $V_2$ based on a control signal provided via the control line 216f. The switching circuitry 214g connects the capacitor 212g to the voltage potentials $V_1$ and $V_2$ based on a control signal provided via the control line 216g.

Each of the switching circuitries 214 is independently controlled via a corresponding control line 216. Accordingly, each of the capacitors 212 is independently selectively coupled to the voltage potential $V_1$ and the voltage potential $V_2$.

A first terminal of each capacitor 222 is connected to the trace 242 and a second terminal of each capacitor 222 is connected to a respective switching circuitry 224. For example, a first terminal of the capacitor 222a is connected to the trace 242 and a second terminal of the capacitor 222a is connected to the switching circuitry 224a. The first terminal of the capacitor 222b is connected to the trace 242 and a second terminal of the capacitor 222b is connected to the switching circuitry 224b. The first terminal of the capacitor 222c is connected to the trace 242 and a second terminal of the capacitor 222c is connected to the switching circuitry 224c. The first terminal of the capacitor 222d is connected to the trace 242 and a second terminal of the capacitor 222d is connected to the switching circuitry 224d. The first terminal of the capacitor 222e is connected to the trace 242 and a second terminal of the capacitor 222e is connected to the switching circuitry 224e. The first terminal of the capacitor 222f is connected to the trace 242 and a second terminal of the capacitor 222f is connected to the switching circuitry 224f. The first terminal of the capacitor 222g is connected to the trace 242 and a second terminal of the capacitor 222g is connected to the switching circuitry 224g.

Each of the switching circuitries 224 are controlled via a corresponding control line 226 and a corresponding control signal provided by the SAR circuitry 146 via the corresponding control line 226. In one example, the switching circuitry 224a connects the capacitor 222a to the voltage potentials $V_1$ and $V_2$ based on a control signal provided via the control line 226a. The switching circuitry 224b connects the capacitor 222b to the voltage potentials $V_1$ and $V_2$ based on a control signal provided via the control line 226b. The switching circuitry 224c connects the capacitor 222c to the voltage potentials $V_1$ and $V_2$ based on a control signal provided via the control line 226c. The switching circuitry 224d connects the capacitor 222d to the voltage potentials $V_1$ and $V_2$ based on a control signal provided via the control line 226d. The switching circuitry 224e connects the capacitor 222e to the voltage potentials $V_1$ and $V_2$ based on a control signal provided via the control line 226e. The switching circuitry 224f connects the capacitor 222f to the voltage potentials $V_1$ and $V_2$ based on a control signal provided via the control line 226f. The switching circuitry 224g connects the capacitor 222g to the voltage potentials $V_1$ and $V_2$ based on a control signal provided via the control line 226g.

While each of the capacitor networks 210 and 220 is illustrated as having seven capacitors, in other examples, the capacitor network 210 and/or 220 may have more or less than seven capacitors. Further, as each of the switching circuitries 224 is independently controlled via a corresponding control line 226, each of the capacitors 222 is independently connected to the voltage potential $V_1$ and the voltage potential $V_2$. In one example, one or more of the capacitors 212 and 222 may be directly connected to the voltage potential V1 or the voltage potential V2, omitting the corresponding switching circuitry 214 or 224.

The SAR circuitry 146 controls the operation of the capacitor network 210 via the control lines 216 and the capacitor network 220 via the control lines 226. For example, the SAR circuitry 146 determines the state of the switching circuitries 214, 224 via the control lines 216 and 226. In one example, the SAR circuitry 146 connects the switching circuitries 214 to the voltage potential $V_1$ and the switching circuitries 224 to the voltage potential $V_1$ to reset each of the capacitors 212, 222. Further, the SAR circuitry 146 controls the switching circuitries 214 to connect the switching circuitries 214 and the capacitors 212 to the voltage potential $V_2$ to charge the capacitors 212 based on the differential voltage signal 141a. The SAR circuitry 146 controls the switching circuitries 224 to connect the switching circuitries 224 and the capacitors 222 to the voltage potential $V_2$ to charge the capacitors 222 based on the voltage signal 141b.

As is noted above, a terminal of each of the capacitors 212 is connected to the trace 240 and a first input node (non-inverting input node) of the comparator circuitry 144, and a terminal of each of the capacitors 222 is connected to the trace 242 and a second input node (inverting input node) of the comparator circuitry 144. The differential voltage signal 141a is driven on the trace 240 and the voltage signal 141b is driven on the trace 242. In one example, the trace 240 is connected to switching circuitry 230 of the track and hold circuit 140. Further, the trace 242 is connected to switching circuitry 232 of the track and hold circuit 140. The SAR circuitry 146 controls the capturing of the voltage signal 143a received at the non-inverting input of the comparator circuitry 144 and the voltage signal 143b received at the inverting input of the comparator circuitry 144 by controlling which of the capacitors 212 and 222 are connected to the first and second voltage potentials $V_1$, $V_2$, via the control lines 216, 226 and the switching circuitries 214, 224. Further, the SAR circuitry 146 controls the switching circuitries 214, 224 to decouple the capacitors 212, 222 from the voltage potentials $V_1$, $V_2$ based on a comparison of the voltages signals 143a, 143b.

The SAR circuitry 146 further controls the state of the switching circuitries 214, 224 via the control lines 216, 226 to control which voltage potential $V_1$, $V_2$ that is connected to the second terminal of each of the capacitors 212, 222 to mitigate offset error within the comparator circuitry 144. The offset error corresponds to comparator mismatch. In one example, the SAR circuitry 146 controls the switching circuitries 214 to connect one or more of the capacitors 212 to the voltage potential $V_1$ to reset the one or more capacitors 212 and to connect one or more of the capacitors 212 to the voltage potential $V_2$ to charge the one or more capacitors 212 and inject an offset voltage into non-inverting input of the comparator circuitry 144. Additionally, or alternatively, the SAR circuitry 146 controls the switching circuitries 224 to connect one or more of the capacitors 222 to the voltage potential $V_1$ to reset the one or more capacitors 222 and to connect one or more of the capacitors 222 to the voltage potential $V_2$ to charge the one or more capacitors 222 and inject an offset voltage into inverting input of the comparator circuitry 144. In other examples, the switching circuitries 214 connect the capacitors 212 to the voltage potential $V_2$ to reset the capacitors 212 and to the voltage potential $V_1$ to charge the capacitors 212, and/or, the switching circuitries 224 connect the capacitors 222 to the voltage potential $V_2$ to reset the capacitors 222 and to the voltage potential $V_1$ to charge the capacitors 222.

Figure 3:
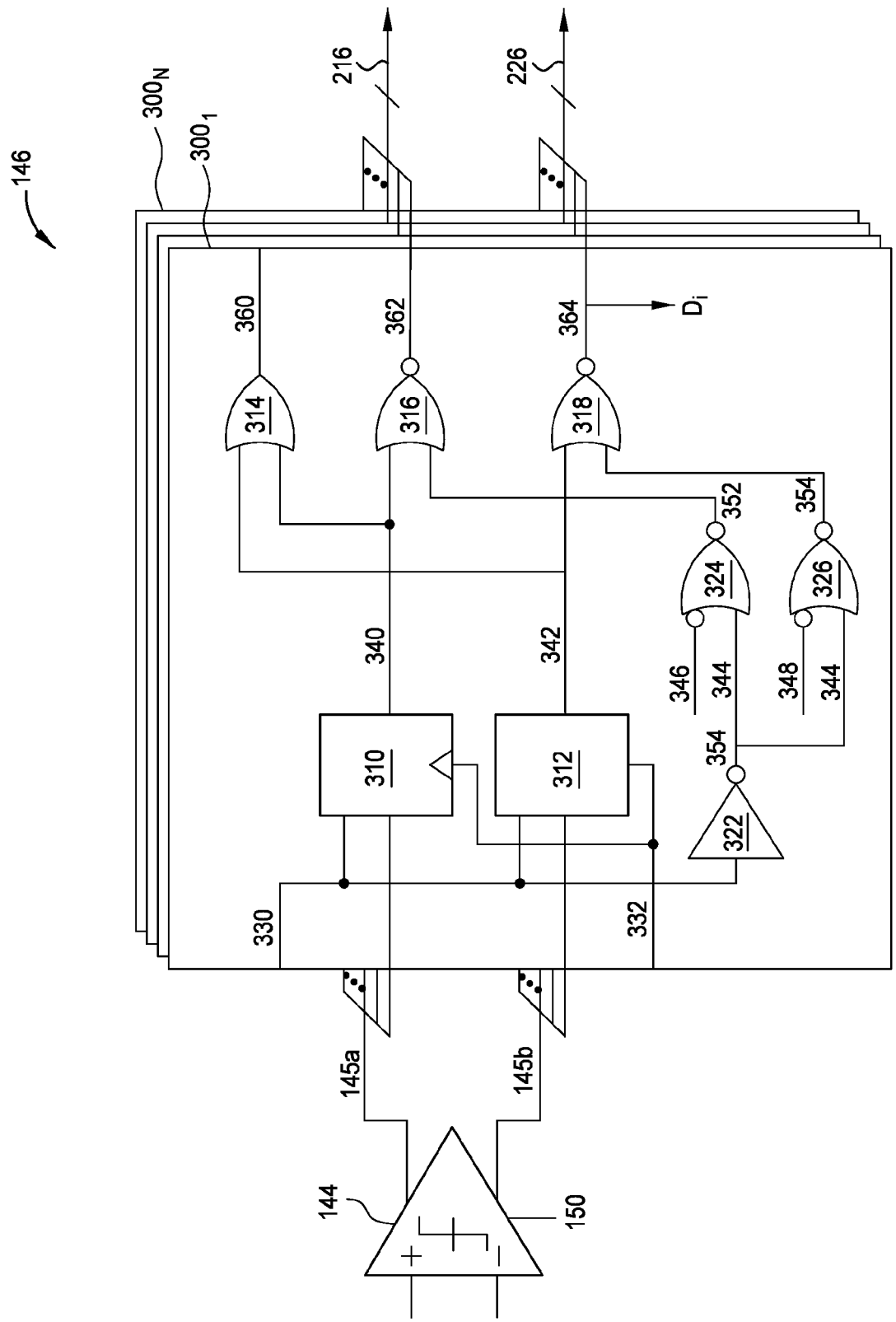
FIG. 3 illustrates a schematic diagram of a successive-approximation-register analog-to-digital converter, according to one or more examples.

FIG. 3 illustrates example SAR circuitry 146, according to one or more examples. The SAR circuitry 146 includes multiple slice circuitries 300. Each slice circuitry 300 is configured to control a different one of the switching circuitries 214 and 224, and correspondingly, a different one of the capacitors 212 and the capacitors 222. The SAR circuitry 146 includes slice circuitries $300_1$ to $300_N$. N correspond to the bit size of the CDAC circuitry 142. Each slice circuitry $300_1$ to $300_N$ is connected to a different one of the controls lines 216 and 226. For example, the slice circuitry $300_1$ controls the switching circuitry 214a via the control line 216a and the switching circuitry 224a via the control line 226a.

Each of the slice circuitries 300 may include similar circuit elements. For example, the slice circuitry $300_1$ includes latch circuit 310, latch circuit 312, inverter 322, OR logic gate 314, and NOR logic gates 316, 318, 324, and 326. In other examples, other types of logic gates may be used instead of the OR logic gate and/or the NOR logic gates. For example, instead of an OR logic gate, NAND logic gates or NOR logic gates may be used. Further, instead of using NOR logic gates, NAND logic gates may be used.

The latch circuit 310 receives the voltage signal 145a, the switching signal 330, and the enable signal 332. The enable signal 332 enables the latch circuit 310, the switching signal 330 resets the latch circuit 310, and the voltage signal 145a is latched by the latch circuit 310. The latch circuit 310 outputs the signal 340 based on the enable signal 332 and the voltage signal 145a. The latch circuit 312 receives the voltage signal 145b, the switching signal 330, and the enable signal 332. In one example, the enable signal 332 is received from another slice circuitry 300. The enable signal 332 enables the latch circuit 312, the switching signal 330 resets the latch circuit 312 and the voltage signal 145b is latched by the latch circuit 312. The latch circuit 312 outputs the signal 342 based on the enable signal 332 and the voltage signal 145b.

The inverter 322 receives the switching signal 330 and outputs an inverted switching signal 344 to the NOR logic gate 324 and the NOR logic gate 326. The NOR logic gate 324 further receives the control signal 346, and the NOR logic gate 326 further receives the control signal 348. The controls signals 346 and 348 are generated by a controller of the receiver circuitry 108. The controls signals 346 and 348 are inverted before at the input of the NOR logic gate 324 and the NOR logic gate 326, respectively.

In one example, based on the inverted switching signal 344 and the inverted control signal 346 having a low voltage value (e.g., a logic 0), the signal 352 output by the NOR logic gate 324 has a high voltage value. Based on the inverted switching signal 344 or the inverted control signal 346 having a high voltage value (e.g., a logic 1), the signal 352 output by the NOR logic gate 324 has a low voltage value. Further, based on the inverted switching signal 344 and the inverted control signal 348 having a low voltage value (e.g., a logic 0), the signal 354 output by the NOR logic gate 326 has a high voltage value. Based on the inverted switching signal 344 or the inverted control signal 348 having a high voltage value (e.g., a logic 1), the signal 354 output by the NOR logic gate 326 has a low voltage value. Further, the signals 352 and 354 may have a high voltage value based on the switching signal 330 having a high voltage level and the control signals 346 and 348 having a high voltage level.

The OR logic gate 314 receives the signals 340 and 342 and generates the enable signal 360. The enable signal 360 has a high voltage level based on the signal 340 or 342 having a high voltage level. The enable signal 360 has a low voltage level based on the signal 340 and 342 both having a low voltage value. In one example, the enable signal 360 is output to another slice circuitry 300 and received by latch circuitry of the other slice circuitry 300.

The NOR logic gate 316 receives the signal 340 and the signal 352, and generates the control signal 362. Based on the signal 340 and the signal 352 having a low voltage value, the control signal 362 has a high voltage level. The control signal 362 has a low voltage value based on either of the signals 340 and 352 having high voltage level. Each slice circuitry 300 generates a control signal 362 for a different one of the switching circuitries 214 and capacitors 212.

The NOR logic gate 318 receives the signal 342 and the signal 354, and generates the control signal 364. Based on the signal 342 and the signal 354 having a low voltage value, the control signal 364 has a high voltage level. The control signal 364 has a low voltage value based on either of the signals 342 and 354 having a high voltage level. Each slice circuitry 300 generates a control signal 364 for a different one of the switching circuitries 224 and capacitors 222.

The control signal 362 is output via a corresponding control line 216 to a corresponding switching circuitry 214 to control whether a corresponding capacitor 212 is connected to the voltage potential $V_1$, the voltage potential $V_2$, or decoupled. The control signal 364 is output via a corresponding control line 226 to a corresponding switching circuitry 224 to control whether a respective capacitor 222 is connected to the voltage potential $V_1$, the voltage potential $V_2$, or decoupled.

Each slice circuitry 300 generates a corresponding control signal 362 and 364 similarly as described above with regard to the slice circuitry $300_1$. In one example, the number of slice circuitries 300 corresponds to the number of capacitors 212 and 222. In such examples, N is two or more. In one example, for a seven bit CDAC (e.g., a CDAC having seven capacitors), the number of slice circuitries 300 is seven. In another example, the number of slice circuitries 300 corresponds to the number of switching circuitries 214 or 224. Further, with reference to FIG. 2, one of the capacitors 212 and 222 may be coupled to the voltage potential $V_1$ or the voltage potential $V_2$ directly, without a switching circuitry. Accordingly, the number of slice circuitries 300 is six.

Further, two or more of the slice circuitries 300 generate the control signals 362 and 364 in parallel. In another example, the slice circuitries 300 generate the control signals 362 and 364 serially with each other.

Figure 4:
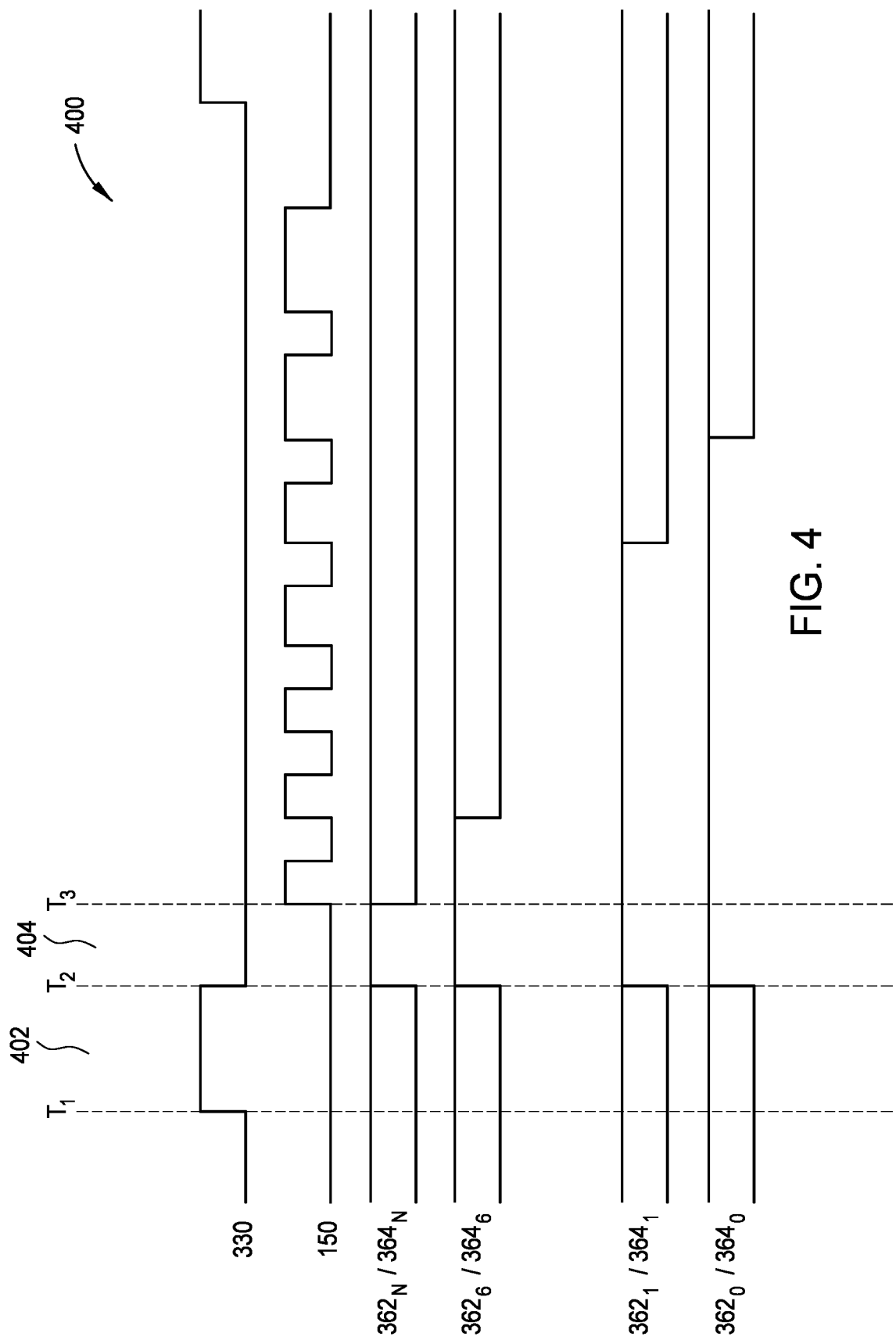
FIG. 4 illustrates waveforms of example voltage signals and control signals, according to one more examples.

FIG. 4 illustrates an example timing diagram 400, according to one or more examples. At time $T_1$, the switching signal 330 transitions from a low voltage level to a high voltage level and at time $T_2$ the switching signal 330 transitions from the high voltage level to the low voltage level. The period between time $T_1$ and time T2 corresponds to a tracking period 402. During the tracking period 402, the switching circuitries 214, 224 are programmed based on the control signal 346, 348. The control signals 346, 348 are offset calibration digital codes that are determined based on mismatch within the comparator circuitry 144. The control signals 346, 348 indicate which of the capacitors 212 are to be coupled to the voltage potential $V_2$ instead of the voltage potential $V_1$, and which of the capacitors 222 are to be coupled to the voltage potential $V_2$ instead of the voltage potential $V_1$. At time $T_1$, one or more of the capacitors 212 is connected to the voltage potential $V_2$ instead of the voltage potential $V_1$. Accordingly, the one or more capacitors 212 is charged based on the voltage potential $V_2$ to inject an offset voltage onto the trace 240 and the non-inverting input of the comparator circuitry 144 instead of being coupled to the voltage potential $V_1$ and reset. At time $T_2$, each of the capacitors 212 that was connected to the voltage potential $V_2$ is connected to the voltage potential $V_1$ to reset the capacitor. The number of capacitors 212 and the amount of charge accumulated on those capacitors 212 during the period 402 between the time $T_1$ and $T_2$ corresponds to the amount of offset voltage that is injected to the non-inverting input of the comparator circuitry 144 at time $T_2$.

Further, at time $T_1$, each capacitor 212 that is not connected to the voltage potential $V_2$ is connected to the voltage potential $V_1$ to reset the capacitor 212. In the example of FIG. 4, each of the control signals $362_0$-$362_N$ configures a corresponding capacitor 212 for offset mitigation (e.g., connects the capacitors 212 to the voltage potential $V_2$). However, in other examples, and as is described in greater detail in the following, less than all of the capacitors 212 may be configured for offset mitigation at time $T_1$.

At time $T_1$, one or more of the capacitors 222 is connected to the voltage potential $V_2$ instead of the voltage potential $V_1$. Accordingly, the one or more capacitors 222 is charged based on the voltage potential $V_2$ to inject an offset voltage onto the trace 242 and the inverting input of the comparator circuitry 144 instead of being coupled to the voltage potential $V_1$ and reset. At time $T_2$, each of the capacitors 222 that was connected to the voltage potential $V_2$ is connected to the voltage potential $V_1$ to be reset.

Further, at time $T_1$, each capacitor 222 that is not connected to the voltage potential $V_2$ is connected to the voltage potential $V_1$ to be reset. In the example of FIG. 4, each of the control signals $364_0$-$364_N$ configures a corresponding capacitor 222 for offset mitigation (e.g., connects the capacitors 222 to the voltage potential $V_2$). However, in other examples, and as is described in greater detail in the following, less than all of the capacitors 222 may be configured for offset mitigation at time $T_1$.

The number of capacitors 212 used for offset calibration (e.g., connected to the voltage potential $V_2$ at time $T_1$) may be equal to, less than, or greater than the number of capacitors 222 used for offset calibration (e.g., connected to the voltage potential $V_2$ at time $T_1$). Further, the number of capacitors 212 and capacitors 222 used for offset calibration may vary over time.

At time $T_3$, conversion of the differential voltage signal 141 is performed by the comparator circuitry 144 and the differential signal 145 is generated by the comparator circuitry 144 from the differential voltage signal 141. Conversion of the differential voltage signal 141 is based on the clock signal 150 and occurs during the time period after $T_3$. Each conversion corresponds to a cycle of the clock signal 150. In another example, each conversion corresponds to a different pair of the capacitors 212, 222. Before time T3, each of the capacitors 212 and 222 are connected to the voltage potential V1 and are reset. During the time period after time T3, and during each conversion, a different capacitor 212 and/or 222 is connected to the voltage potential V2 based on the output signal (e.g., differential signal 145) of the comparator circuitry 144.

The timing diagram 400 indicates that the control signals $362_0$-$362_6$ and the control signals $364_0$-$364_6$ are indicating that the corresponding capacitors 212 and 222 are to be used for offset mitigation. However, in other examples, less than all of the capacitors 212 and 222 are used for offset mitigation.

In the time period 402 between time $T_1$ and time $T_2$, charge is accumulated on each of the capacitors 212, 222 being used for offset mitigation. At time $T_2$, the capacitors 212 being used for offset mitigation are transitioned from being connected to the voltage potential $V_2$ to the voltage potential $V_1$, and any charge on the capacitors 212 is injected onto the trace 240 and into the non-inverting input of the comparator circuitry 144. Further, at time $T_2$, the capacitors 222 being used for offset mitigation are transitioned from being connected to the voltage potential $V_2$ to the voltage potential $V_1$, and any charge on the capacitors 222 is injected onto the trace 242 and into the inverting input of the comparator circuitry 144.

The length of the period 404 between time $T_2$ and $T_3$ is long enough to allow the offset voltage injected onto the trace 240 and 242 to settle and the capacitors 212 and 222 to be reset.

The control signals 346, 348 having a logic 0 value, the corresponding switching circuitry 214, 224 functions to reset the corresponding capacitors 212, 222 at time $T_1$. In one example, the control signal 346 associated with the capacitor 212a is $OS_{P0}$ and the control signal 348 associated with the capacitor 222a is $OS_{M0}$. Setting each of $OS_{P0}$ and $OS_{M0}$ to logic 0 (a low voltage value) provides an indication to reset the capacitors 212a and 222a at time $T_1$. Further, setting each of $OS_{P0}$ and $OS_{M0}$ to logic 1 (a high voltage value) provides an indication to use the capacitors 212a and 222a for offset mitigation. Accordingly, after the switching circuitries 230 and 232 of the track and hold circuit 140 are opened at time $T_2$ based on the switching signal 330, the capacitor 212a is connected with the voltage potential $V_1$ and the capacitor 222a is connected with the voltage potential $V_1$, resetting the capacitors and injecting charge (e.g., an offset voltage) into the comparator circuitry 144.

In one example, the capacitor 212a injects an offset voltage of $V_{FS}/2^{B-(i-1)}$ and the capacitor 222a injects an offset voltage of $-V_{FS}/2^{B-(i-1)}$. $V_{FS}$ is the full-scale range of the corresponding ADC circuitry (e.g., the ADC circuitry 122), and B is the ADC resolution (e.g., the resolution of the CDAC circuitry 142). The total offset voltage ($V_{OS\_INJ}$) used for offset mitigation is the sum of injected offset voltage. Accordingly, the offset codes (e.g., the value of the control signals 346, 348) is determined based on:

$$V_{OS\_INJ} = \sum_{i=1}^{7} \frac{V_{FS}}{2^{B-(i-1)}} \left( OS_{P,i-1} - OS_{m,i-1} \right). \quad \text{Equation 1}$$

To inject a positive amount of voltage (e.g., a positive $V_{OS\_INJ}$), the number of the capacitors 212 used for offset mitigation is greater than the number of the capacitors 222 used for offset mitigation. Further, to inject a negative amount of voltage (e.g., a negative VOS_INJ); the number of capacitors 222 used for offset mitigation is greater than the number of the capacitors 212 used for offset mitigation. The truth table 500 of FIG. 5 illustrates the offset charge that is injected based on the control signals 346 and 348.

The amount of offset voltage injected (e.g., the amount of offset mitigation) is determined by DSP circuitry (e.g., the DSP circuitry 126) connected to the output of the ADC circuitry (e.g., the ADC circuitry 122). With reference to FIG. 1, the DSP circuitry 126 may include calibration circuitry that measures the digital signal 123 to determine the amount of offset mitigation to apply to the ADC circuitry 122. In one example, the DSP circuitry 126 determines the amount of offset mitigation at start up, after reset, or at power on of the ADC circuitry 122. In other examples, the DSP circuitry 126 determines the amount of offset mitigation during operation of the ADC circuitry 122.

Figure 6:
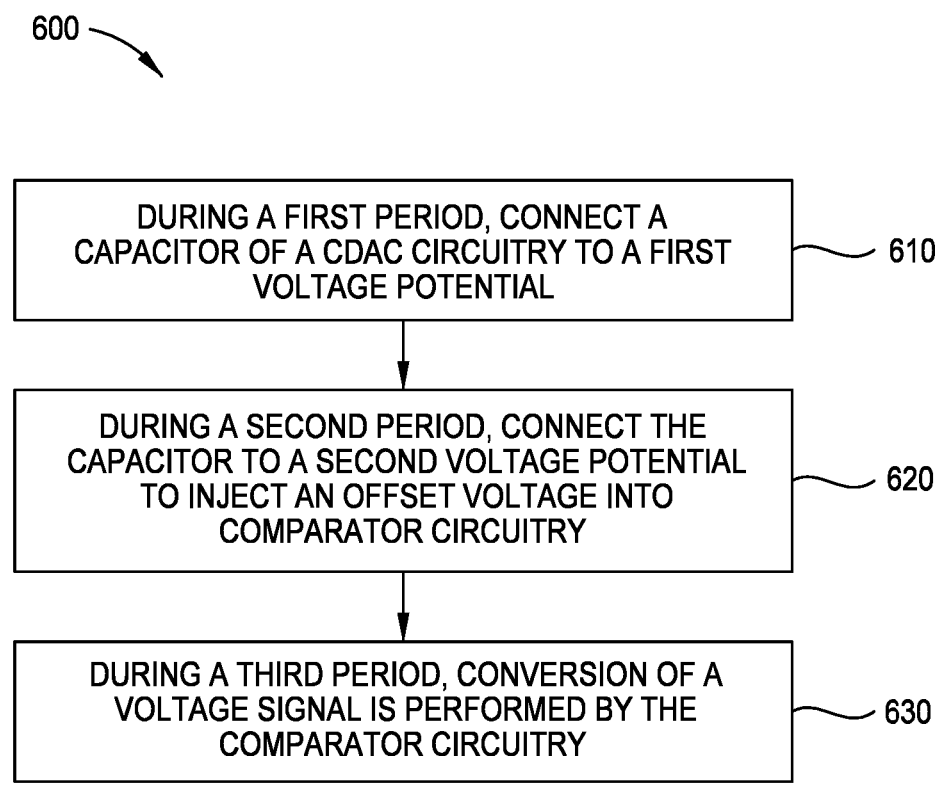
FIG. 6 illustrates a method for operating an analog-to-digital converter, according to one more examples.

FIG. 6 illustrates a method 600 for mitigating offset within and operating ADC circuitry, according to one or more examples. At block 610, a first capacitor of a CDAC circuitry is connected to a first voltage potential during a first period. For example, with reference to FIGS. 2 and 4, during period 402, the capacitor 212a is connected to the voltage potential $V_2$. The SAR circuitry 146 communicates a control signal (e.g., the control signal 362) via the control line 216a to the switching circuitry 214a. The switching circuitry 214a connects a terminal of the capacitor 212a to the voltage potential $V_2$ based on the control signal 362. Additionally, or alternatively, during period 402, one or more of the capacitors 212b - 212g is connected to the voltage potential $V_2$. The SAR circuitry 146 communicates a control signal (e.g., the control signal 362) via a respective one of the control lines 216b-g to a respective switching circuitry 214b-g. The switching circuitries 214b-g connect a second terminal of a respective the capacitor 212b - 212g to the voltage potential $V_2$ based on a corresponding control signal 362.

Further, in one example, during the period 402, the capacitor 222a is connected to the voltage potential $V_2$. The SAR circuitry 146 communicates a control signal (e.g., the control signal 364) via the control line 226a to the switching circuitry 224a. The switching circuitry 224a connects a terminal of the capacitor 222a to the voltage potential $V_2$ based on the control signal 364. Additionally, or alternatively, during period 402, one or more of the capacitors 222b - 222g is connected to the voltage potential $V_2$. The SAR circuitry 146 communicates a control signal (e.g., the control signal 364) via a respective one of the control lines 226b-g to a respective switching circuitry 224b-g. The switching circuitries 224b-g connect a terminal of a respective the capacitor 222b - 222g to the voltage potential $V_2$ based on a corresponding control signal 364.

At block 620, the first capacitor is connected to a second voltage potential to inject an offset voltage into a comparator circuitry, during a second period. For example, with reference to FIGS. 2 and 4, during the period 404, the capacitor 212a is connected to the voltage potential $V_1$. The SAR circuitry 146 communicates a control signal (e.g., the control signal 362) via the control line 216a to the switching circuitry 214a, and the switching circuitry 214a connects the terminal of the capacitor 212a to the voltage potential $V_1$ based on the control signal 362. Connecting the terminal of the capacitor 212a to the voltage potential $V_1$ resets the capacitor 212a, injecting a voltage into the comparator circuitry 144 corresponding to the amount of charge on the capacitor 212a.

Additionally, or alternatively, during period 404, one or more of the capacitors 212b - 212g is connected to the voltage potential $V_1$ based on a corresponding control signal communicated on a corresponding control line 216. Accordingly, an offset voltage is injected into the comparator based on the amount charge stored on the capacitors 212b - 212g.

Further, in one example, during the period 404, the capacitor 222a is connected to the voltage potential $V_1$. The SAR circuitry 146 communicates a control signal (e.g., the control signal 364) via the control line 226a to the switching circuitry 224a, and the switching circuitry 224a connects the terminal of the capacitor 222a to the voltage potential $V_1$ based on the control signal 364. Connecting the terminal of the capacitor 222a to the voltage potential $V_1$ resets the capacitor 222a, injecting an offset voltage into the comparator circuitry 144 corresponding to the amount of charge on the capacitor 222a.

Additionally, or alternatively, during period 404, one or more of the capacitors 222b - 222g is connected to the voltage potential $V_1$ based on a corresponding control signal communicated on a corresponding control line 226. Accordingly, an offset voltage is injected into the comparator based on the amount charge stored on the capacitors 222b - 222g.

During block 630, during a third period (e.g., after period 404 and time $T_3$), conversion of a voltage signal is performed by the comparator circuitry. For example, with reference to FIG. 2 and FIG. 4, conversion of the differential voltage signal 141 is performed beginning at $T_s$ by the comparator circuitry 144 and the differential signal 145 is generated by the comparator circuitry 144 from the differential voltage signal 141.

In the above, a system and method for mitigating offset within an ADC circuitry is described. The mismatch is due to comparator circuitry mismatch within the ADC circuitry and may limit the resolution of the ADC circuitry. To mitigate the offsets caused by mismatch within the ADC circuitry, a CDAC circuitry of the ADC circuitry is used to inject an offset voltage into the comparator circuitry and other elements of the ADC circuitry. For example, instead of resetting one or more capacitors of the CDAC circuitry, the one or more capacitors are configured to inject an offset voltage into the comparator circuitry. Reusing the CDAC circuitry to mitigate offset within the ADC circuitry, decreases the loading of the comparator circuitry and the circuit size of the ADC circuitry, allowing the ADC circuitry to operate at higher operating speeds as compared to ADC circuitries that employ other methods for offset mitigation.

While the foregoing is directed to specific examples, other and further examples may be devised without departing from the basic scope thereof, and the scope thereof is determined by the claims that follow.

What is claimed is:

1. An analog-to-digital converter (ADC) circuitry comprising:
    comparator circuitry comprising a non-inverting input and an inverting input configured to selectively receive a differential voltage signal, and an output;
    capacitor digital-to-analog converter (CDAC) circuitry comprising:
        a first capacitor network comprising a first plurality of capacitors, wherein a first capacitor of the first plurality of capacitors comprises a first terminal connected to the non-inverting input and a second terminal configured to be selectively connected to a first voltage potential and a second voltage potential, the first voltage potential is greater than the second voltage potential; and
    successive approximation register (SAR) circuitry connected to the output and the first capacitor network, wherein the SAR circuitry is configured to:
        connect, during a first period, the second terminal of the first capacitor to the second voltage potential, wherein the non-inverting input and the inverting input are connected to the differential voltage signal and the first terminal of the first capacitor is configured to receive a first signal of the differential voltage signal during the first period.

2. The ADC circuitry of claim 1, wherein the SAR circuitry is further configured to:
    connect, during a second period, the second terminal of the first capacitor to the first voltage potential to inject an offset voltage onto the non-inverting input and reset the first capacitor, wherein the second period occurs after the first period, and wherein, during the second period, the non-inverting input and the inverting input are disconnected from the differential voltage signal.

3. The ADC circuitry of claim 1, wherein the CDAC circuitry further comprises:
    a second capacitor network comprising a second plurality of capacitors, wherein a second capacitor of the second plurality of capacitors comprises a first terminal connected to the inverting input and a second terminal configured to be selectively connected to the first voltage potential and the second voltage potential.

4. The ADC circuitry of claim 3, wherein the SAR circuitry is further configured to:
    connect, during the first period, the second terminal of the second capacitor to the second voltage potential; and
    connect, during a second period, the second terminal of the first capacitor to the first voltage potential and the second terminal of the second capacitor to the first voltage potential to inject a first amount of offset voltage into the non-inverting input and a second amount of offset voltage into the inverting input, wherein the second period occurs after the first period, wherein, during the second period, the non-inverting input and the inverting input are disconnected from the differential voltage signal.

5. The ADC circuitry of claim 4, wherein the comparator circuitry is configured to process, during a third period, the differential voltage signal, wherein the third period occurs after the second period, and wherein, during the third period, the SAR circuitry is further configured to connect at least one of the second terminal of the first capacitor and the second terminal of the second capacitor to the second voltage potential.

6. The ADC circuitry of claim 4, wherein the first capacitor network further comprises:

first switching circuitry configured to selectively coupled a second terminal of each of the first plurality of capacitors to the first voltage potential and the second voltage potential based on first control signals received from the SAR circuitry, and wherein the second capacitor network further comprises:
second switching circuitry configured to selectively coupled a second terminal of each of the second plurality of capacitors to the first voltage potential and the second voltage potential based on second control signals received from the SAR circuitry.

7. The ADC circuitry of claim 1, wherein the SAR circuitry is further configured to:
connect, during the first period, a second terminal of a third capacitor of the first plurality of capacitors to the first voltage potential;
connect, during a second period, the second terminal of the first capacitor and the second terminal of the third capacitor to the first voltage potential; and
connect, during a third period, one or more of the second terminal of the first capacitor and the second terminal of the third capacitor to the first voltage potential, wherein, during the third period, the comparator circuitry is configured to process the differential voltage signal, and wherein the second period occurs between the first period and the third period.

8. A method for operating an analog-to-digital converter (ADC) circuitry, the method comprising:
connecting, during a first period, a non-inverting input and an inverting input of comparator circuitry to a differential voltage signal; and
connecting, during the first period and via successive approximation register (SAR) circuitry, a first terminal of a first capacitor of a first capacitor network of capacitor digital-to-analog converter (CDAC) circuitry to a second voltage potential, wherein the first terminal of the first capacitor is configured to be selectively connected to a first voltage potential and the second voltage potential, the first voltage potential is greater than the second voltage potential, and wherein a second terminal of the first capacitor is connected to the non-inverting input and configured to receive a first signal of the differential voltage signal during the first period.

9. The method of claim 8 further comprising:
connecting, during a second period and via the SAR circuitry, the first terminal of the first capacitor to the first voltage potential to reset the first capacitor and inject an offset voltage onto the non-inverting input, wherein the second period occurs after the first period.

10. The method of claim 9 further comprising:
disconnecting, during the second period, the non-inverting input and the inverting input from the differential voltage signal.

11. The method of claim 8 further comprising:
connecting, during the first period and via the SAR circuitry, a first terminal of a second capacitor of a second capacitor network of the CDAC circuitry to the second voltage potential, wherein the second capacitor comprises a second terminal connected to the inverting input, and wherein the first terminal of the second capacitor is configured to be selectively connected to the first voltage potential and the second voltage potential.

12. The method of claim 11 further comprising:
connecting, during a second period, the first terminal of the first capacitor to the first voltage potential and the first terminal of the second capacitor to the first voltage potential to inject a first amount of offset voltage into the non-inverting input and a second amount of offset voltage into the inverting input, wherein the second period occurs after the first period; and
disconnecting, during the second period, the non-inverting input and the inverting input from the differential voltage signal.

13. The method of claim 12 further comprising
processing, during a third period, the differential voltage signal, wherein the third period occurs after the second period, and wherein, during the third period, the SAR circuitry is further configured to connect one or more of the first terminal of the first capacitor and the first terminal of the second capacitor to the second voltage potential.

14. The method of claim 8 further comprising:
connecting, during the first period, a first terminal of a third capacitor of the first capacitor network to the first voltage potential;
connecting, during a second period, the first terminal of the first capacitor and the first terminal of the third capacitor to the first voltage potential; and
connecting, during a third period, one or more of the first terminal of the first capacitor and the first terminal of the third capacitor to the first voltage potential.

15. Receiver circuitry comprising:
analog-to-digital converter (ADC) circuitry configured to receive an input signal and output an output signal based on the input signal, the ADC circuitry comprising:
comparator circuitry comprising a non-inverting input, an inverting input, and an output, wherein the comparator circuitry is configured to selectively receive a differential voltage signal at the non-inverting input and inverting input, the differential voltage signal based on the input signal; and
capacitor digital-to-analog converter (CDAC) circuitry comprising:
a first capacitor network comprising a first plurality of capacitors, wherein a first capacitor of the first plurality of capacitors comprises a first terminal connected to the non-inverting input and a second terminal configured to be selectively connected to a first voltage potential and a second voltage potential, the first voltage potential is greater than the second voltage potential,
wherein the ADC circuitry is configured to:
connect, during a first period, the second terminal of the first capacitor to the second voltage potential, wherein the non-inverting input and the inverting input are connected to the differential voltage signal and the first terminal of the first capacitor is configured to receive a first signal of the differential voltage signal during the first period.

16. The receiver circuitry of claim 15, wherein the ADC circuitry is further configured to:
connect, during a second period, the second terminal of the first capacitor to the first voltage potential to inject an offset voltage into the non-inverting input and reset the first capacitor, wherein the second period occurs after the first period, and wherein, during the second period, the non-inverting input and the inverting input are disconnected from the differential voltage signal.

17. The receiver circuitry of claim 16, wherein the CDAC circuitry further comprises:
a second capacitor network comprising a second plurality of capacitors, wherein a second capacitor of the second plurality of capacitors comprises a first terminal connected to the inverting input and a second terminal configured to be selectively connected to the first voltage potential and the second voltage potential.

18. The receiver circuitry of claim 17, wherein the ADC circuitry is further configured to:

connect, during the first period, the second terminal of the second capacitor to the second voltage potential;

connect, during the second period, the second terminal of the first capacitor to the first voltage potential and the second terminal of the second capacitor to the first voltage potential to inject a first amount of offset voltage into the non-inverting input and a second amount of offset voltage into the inverting input, wherein the second period occurs after the first period; and disconnect, during the second period, the non-inverting input and the inverting input from the differential voltage signal.

19. The receiver circuitry of claim 18, wherein the first capacitor network further comprises:

first switching circuitry configured to selectively coupled a second terminal of each of the first plurality of capacitors to the first voltage potential and the second voltage potential based on first control signals received from the ADC circuitry, and wherein the second capacitor network further comprises:

second switching circuitry configured to selectively coupled a second terminal of each of the second plurality of capacitors to the first voltage potential and the second voltage potential based on second control signals received from the ADC circuitry.

20. The receiver circuitry of claim 18, wherein the ADC circuitry is further configured to:

connect, during the first period, a second terminal of a third capacitor of the first plurality of capacitors to the first voltage potential;

connect, during the second period, the second terminal of the first capacitor and the second terminal of the third capacitor to the first voltage potential; and connect, during a third period, one or more of the second terminal of the first capacitor and the second terminal of the third capacitor to the first voltage potential, wherein, during the third period, the comparator circuitry is configured to process the differential voltage signal, and wherein the second period occurs between the first period and the third period.

* * * * *